United States Patent
Yun et al.

(10) Patent No.: US 7,294,580 B2
(45) Date of Patent: *Nov. 13, 2007

(54) METHOD FOR PLASMA STRIPPING USING PERIODIC MODULATION OF GAS CHEMISTRY AND HYDROCARBON ADDITION

(75) Inventors: Seokmin Yun, Pleasanton, CA (US); Ji Zhu, El Cerrito, CA (US); Peter Cirigliano, Sunnyvale, CA (US); Sangheon Lee, San Jose, CA (US); Thomas S. Choi, San Jose, CA (US); Peter Loewenhardt, Pleasanton, CA (US); Mark H. Wilcoxson, Piedmont, CA (US); Reza Sadjadi, Saratoga, CA (US); Eric A. Hudson, Berkeley, CA (US); James V. Tietz, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 238 days.

This patent is subject to a terminal disclaimer.

(21) Appl. No.: 10/860,833

(22) Filed: Jun. 3, 2004

(65) Prior Publication Data

US 2004/0224520 A1    Nov. 11, 2004

Related U.S. Application Data

(63) Continuation-in-part of application No. 10/411,520, filed on Apr. 9, 2003, now Pat. No. 6,916,746.

(51) Int. Cl.
   *H01L 21/00*   (2006.01)
(52) U.S. Cl. ............... 438/710; 438/696; 438/706; 438/712; 438/714; 438/720; 216/67

(58) Field of Classification Search ............... 438/706, 438/710, 712, 714, 720, 696; 216/58, 67
See application file for complete search history.

(56) References Cited

U.S. PATENT DOCUMENTS 4,414,059 A    11/1983   Blum et al. ............... 156/659.1

(Continued)

FOREIGN PATENT DOCUMENTS

DE    10059836    6/2002

(Continued)

OTHER PUBLICATIONS

Eto et al., "High Selectivity Photoresist Ashing by the Addition of $NH_3$ to $CF_4/O_2$ or $CHF_3/O_2$", SID 99 Digest, pp. 844-847.

(Continued)

*Primary Examiner*—Shamim Ahmed
(74) *Attorney, Agent, or Firm*—Beyer Weaver LLP

(57) ABSTRACT

A method for etching a feature in a low-k dielectric layer through a photoresist etch mask over a substrate. A gas-modulated cyclic stripping process is performed for more than three cycles for stripping a single photoresist mask. Each cycle of the gas-modulated cyclic stripping process comprises performing a protective layer formation phase and a stripping phase. The protective layer forming phase using first gas chemistry with a deposition gas chemistry, wherein the protective layer forming phase is performed in about 0.005 to 10 seconds for each cycle. The performing the stripping phase for stripping the photoresist mask using a second gas chemistry using a stripping gas chemistry, where the first gas chemistry is different than the second gas chemistry, wherein the etching phase is performed in about 0.005 to 10 seconds for each cycle.

20 Claims, 7 Drawing Sheets

U.S. PATENT DOCUMENTS

| | | | |
|---|---|---|---|
| 4,795,529 A | | 1/1989 | Kawasaki et al. |
| 5,468,686 A | * | 11/1995 | Kawamoto ................. 438/714 |
| 5,498,312 A | | 3/1996 | Laermer et al. |
| 5,501,893 A | | 3/1996 | Laermer et al. |
| 5,545,289 A | * | 8/1996 | Chen et al. ................. 438/694 |
| 5,562,801 A | | 10/1996 | Nulty |
| 5,882,535 A | | 3/1999 | Stocks et al. |
| 5,942,446 A | | 8/1999 | Chen et al. |
| 6,025,255 A | | 2/2000 | Chen et al. |
| 6,046,115 A | | 4/2000 | Molloy et al. ............... 438/710 |
| 6,051,503 A | | 4/2000 | Bhardwaj et al. ........... 438/705 |
| 6,071,822 A | | 6/2000 | Donohue et al. ........... 438/712 |
| 6,074,959 A | | 6/2000 | Wang et al. |
| 6,100,200 A | | 8/2000 | Van Buskirk et al. ....... 438/697 |
| 6,127,273 A | | 10/2000 | Laermer et al. |
| 6,187,666 B1 | | 2/2001 | Singh et al. |
| 6,187,685 B1 | | 2/2001 | Hopkins et al. |
| 6,200,822 B1 | | 3/2001 | Becker et al. |
| 6,211,092 B1 | | 4/2001 | Tang et al. |
| 6,214,161 B1 | | 4/2001 | Becker et al. |
| 6,261,962 B1 | | 7/2001 | Bhardwaj et al. |
| 6,284,148 B1 | | 9/2001 | Laermer et al. |
| 6,303,512 B1 | | 10/2001 | Laermer et al. |
| 6,316,169 B1 | | 11/2001 | Vahedi et al. |
| 6,326,307 B1 | | 12/2001 | Lindley et al. |
| 6,387,287 B1 | | 5/2002 | Hung et al. |
| 6,403,491 B1 | | 6/2002 | Liu et al. |
| 6,406,995 B1 | | 6/2002 | Hussein et al. |
| 6,488,862 B1 | * | 12/2002 | Ye et al. ....................... 216/67 |
| 6,489,632 B1 | | 12/2002 | Yamazaki et al. |
| 6,500,743 B1 | * | 12/2002 | Lopatin et al. ............. 438/592 |
| 6,518,192 B2 | * | 2/2003 | Khan et al. ................. 438/714 |
| 6,537,906 B1 | * | 3/2003 | Mori ........................... 438/636 |
| 6,569,774 B1 | | 5/2003 | Trapp |
| 6,617,253 B1 | | 9/2003 | Chu et al. |
| 6,632,903 B2 | | 10/2003 | Jung et al. ................. 526/269 |
| 6,647,994 B1 | | 11/2003 | Lui et al. |
| 6,833,325 B2 | | 12/2004 | Huang et al. |
| 6,916,746 B1 | | 7/2005 | Hudson et al. |
| 2003/0027427 A1 | * | 2/2003 | Ma et al. ..................... 438/700 |

FOREIGN PATENT DOCUMENTS

| | | |
|---|---|---|
| EP | 0 268 021 A2 | 5/1988 |
| EP | 0 363 982 A2 | 4/1990 |
| EP | 0 822 582 A2 | 2/1998 |
| JP | S63-13334 | 1/1988 |
| JP | 07226397 | 8/1995 |
| JP | 09036089 | 2/1997 |
| JP | 2001068462 | 3/2001 |
| WO | 00/30168 | 5/2000 |
| WO | 01/04707 A1 | 1/2001 |
| WO | 01/29879 A2 | 4/2001 |
| WO | 01/29879 A2 | 4/2001 |
| WO | 01/29879 A3 | 4/2001 |
| WO | 2004/034445 A2 | 4/2004 |

OTHER PUBLICATIONS

International Search Report, dated Sep. 10, 2004.
International Search Report and Written Opinion mailed Oct. 7, 2005.
U.S. Appl. No. 10/674,675, filed Sep. 29, 2003.
U.S. Appl. No. 10/946,181, filed Sep. 20, 2004.
U.S. Appl. No. 11/055,878, filed Feb. 11, 2005.
International Search Report, dated Feb. 24, 2004.
Office Action mailed Jun. 23, 2005, U.S. Appl. No. 10/674,675.
Office Action mailed Nov. 15, 2005, U.S. Appl. No. 10/674,675.
Office Action mailed Apr. 12, 2006, U.S. Appl. No. 10/674,675.
Eto et al., "High Selectivity Photoresist Ashing by the Addition of $NH_3$ to $CF_4/O_2$ or $CHF_3/O_2$", SID 99 Digest, pp. 844-847, May 18, 1999.

* cited by examiner

METHOD FOR PLASMA STRIPPING USING PERIODIC MODULATION OF GAS CHEMISTRY AND HYDROCARBON ADDITION

RELATED APPLICATIONS

This application is a continuation-in-part of U.S. patent application Ser. No. 10/411,520, now U.S. Pat. No. 6,916,746, entitled "METHOD FOR PLASMA ETCHING USING PERIODIC MODULATION OF GAS CHEMISTRY," by Hudson et al. filed Apr. 9, 2003, which is hereby incorporated by reference.

BACKGROUND OF THE INVENTION

1. Field of the Invention

The invention relates to a method of obtaining a structure on a semiconductor wafer by etching through structures defined by a photoresist mask and then stripping the mask.

2. Description of the Related Art

In semiconductor plasma etching applications, a plasma etcher is usually used to transfer a mask pattern into a circuit and line pattern of a desired thin film and/or filmstack (conductors or dielectric insulators) on a wafer. This is achieved by etching away the films (and filmstacks) underneath the photoresist materials in the opened areas of the mask pattern. This etching reaction may be initiated by the chemically active species and electrically charged particles (ions) generated by exciting an electric discharge in a reactant mixture contained in a vacuum enclosure also referred to as a reactor or process chamber. Additionally, the ions may be also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping them away, leaving in its place a replica of the lateral pattern of the original intended mask patterns. During the etching process, the mask materials are usually eroded and/or damaged in exchange for the pattern transfer. Consequently, some of the damage and erosion also may be transferred to the underlying layers leaving such undesirable pattern distortions such as striation, CD enlargement, faceting, etc.

In addition, for low-k dielectric materials (k<3.0), during the stripping of the photoresist, damage may occur to the low-k dielectric material, which may increase the k value. In such a stripping process, it is desirable to limit such damage during the stripping process.

SUMMARY OF THE INVENTION

To achieve the foregoing and in accordance with the purpose of the present invention, a method for etching a feature in a low-k dielectric layer through a photoresist etch mask over a substrate is provided. A low-k dielectric layer is placed over a substrate. A patterned photoresist mask is placed over the low-k dielectric layer. At least one feature is etched into the low-k dielectric layer. A gas-modulated cyclic stripping process is performed for more than three cycles for stripping a single photoresist mask. Each cycle of the gas-modulated cyclic stripping process comprises performing a protective layer formation phase and a stripping phase. The protective layer forming phase using first gas chemistry with a deposition gas chemistry, wherein the protective layer forming phase is performed in about 0.005 to 10 seconds for each cycle, comprises providing the first gas chemistry and forming a plasma from the first gas chemistry, wherein a protective layer is formed on sidewalls of the at least one feature and a thickness of the protective layer is increased. The performing the stripping phase for stripping the photoresist mask using a second gas chemistry using a stripping gas chemistry, where the first gas chemistry is different than the second gas chemistry, wherein the etching phase is performed in about 0.005 to 10 seconds for each cycle comprises providing the second gas chemistry and forming a plasma from the second gas chemistry, wherein the thickness of the protective layer is decreased and some of the photoresist mask is stripped.

In another embodiment of the present invention, a method for removing at least part of a single layer over a substrate is provided. A gas-modulated cyclic process is performed for more than three cycles. The gas-modulated cyclic process comprises performing a protective layer forming phase using first gas chemistry with a deposition gas chemistry, wherein the protective layer forming phase is performed in about 0.005 to 10 seconds for each cycle and performing a removal phase for removing at least part of the single layer using a second gas chemistry using a removal gas chemistry, where the first gas chemistry is different than the second gas chemistry, wherein the removal phase is performed in about 0.005 to 10 seconds for each cycle. The protective layer forming comprises providing the first gas chemistry and forming a plasma from the first gas chemistry, which causes a protective layer formed and the thickness of the protective layer to increase. The removal phase comprises providing the second gas chemistry and forming a plasma from the second gas chemistry to cause removal of at least part of the single layer.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
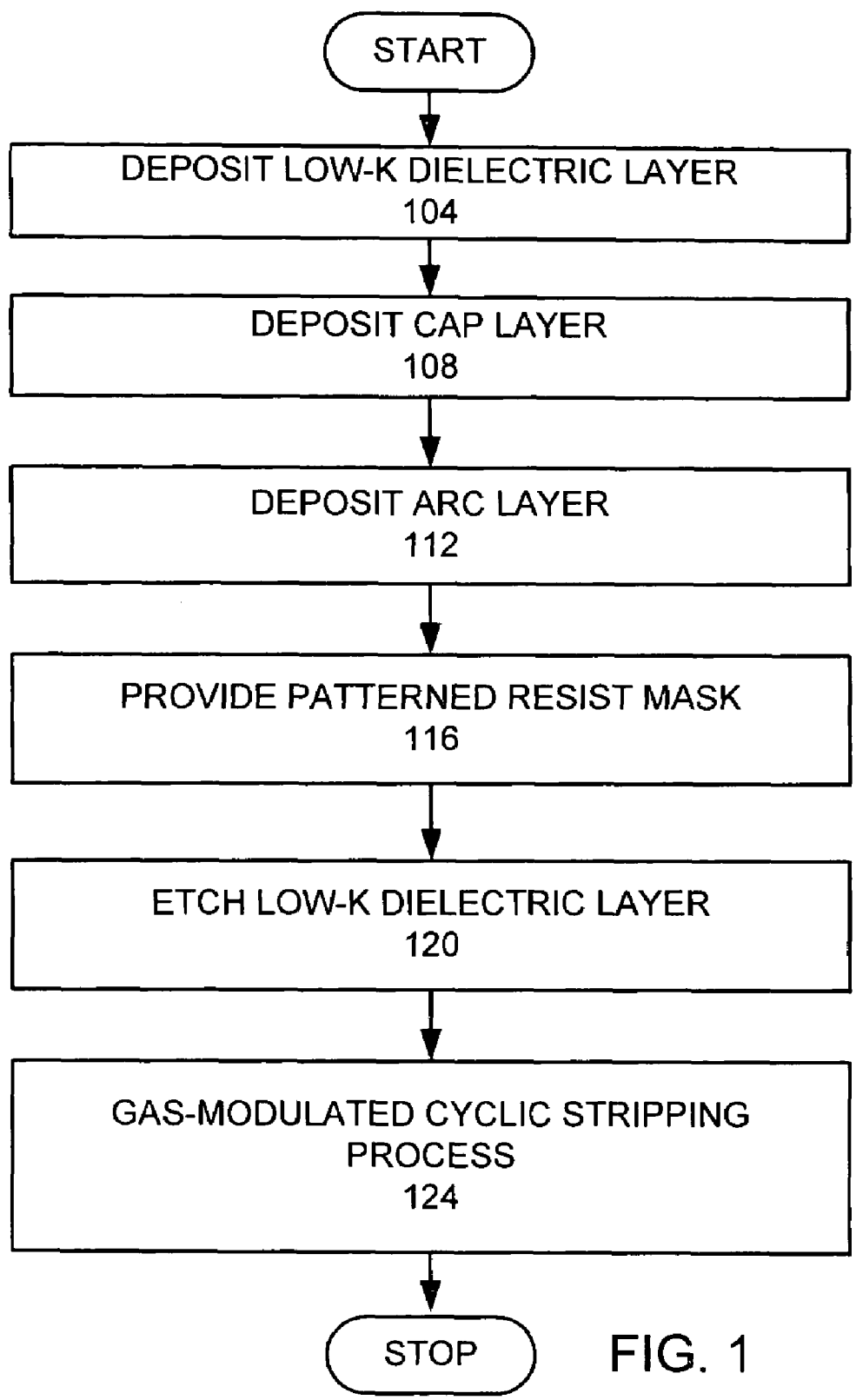
FIG. 1 is a flow chart of a process used in an embodiment of the invention.
Figure 2A:
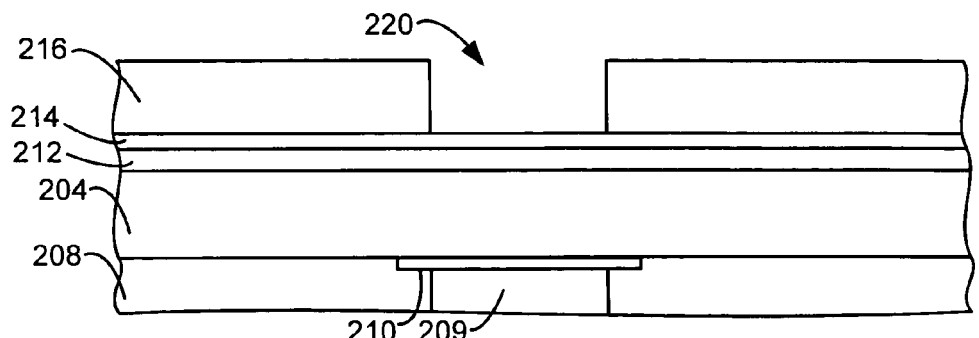
FIGS. 2A-C are schematic side views of an etched low-k dielectric layer according to the process of FIG. 1.
Figure 2B:
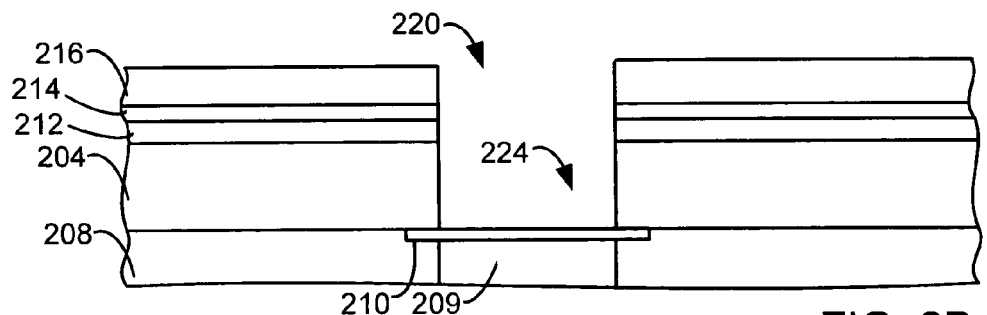
Figure 2C:
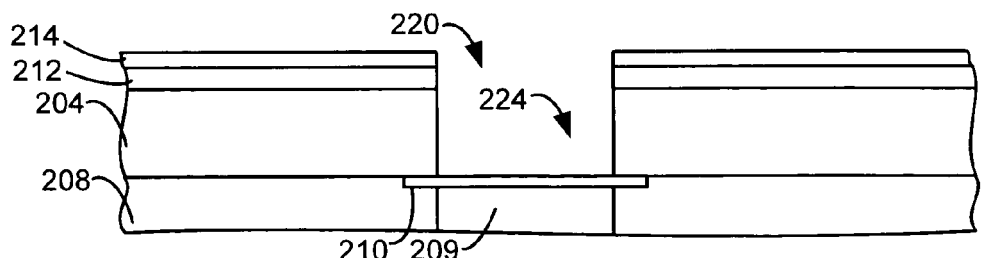

To facilitate discussion, FIG. 1 is a flow chart of an etching process of low-k dielectric layer used in an embodiment of the invention. Preferably, the low-k dielectric layer is an organosilicate glass (OSG). FIGS. 2A-C are schematic side views of a low-k dielectric layer according to the process of FIG. 1. A low-k dielectric layer 204 may be deposited over a substrate 208 (step 104), as shown in FIG. 2A. The substrate 208 may be a silicon wafer or another type of material or may be part of a layer over a wafer. A cap layer 212 is formed over the low-k dielectric layer 204 (step 108). The cap layer 212 may be silicon oxide. Generally, the cap layer is a protective layer of a dielectric material. The cap layer 212 protects the low-k dielectric layer 204 during chemical mechanical polishing (CMP) and other processes. The cap layer 212 may be a low-k dielectric, since the cap layer is part of the end product. Preferably, the cap layer is of a silicon oxide base material. The cap layer is preferably has a thickness of between about 200 Å and about 1000 Å. In other embodiments, there may be more than one cap layer or no cap layer. An antireflective coating (ARC) 214 is deposited over the cap layer 212 (step 112). The antireflective coating (ARC) 214 may be an organic bottom antireflective coating (BARC) or an inorganic dielectric antireflective coating (DARC). The ARC has a thickness between about 100 Å and about 1000 Å. A patterned resist mask 216 is provided over the ARC 214 (step 116). The patterned resist mask 216 has an aperture 220. The patterned resist mask may be formed by placing a layer of photoresist, which is exposed to a light pattern and then etched. Other methods of forming a patterned resist mask may be used. The substrate 208 may have a contact 209 and a barrier layer 210.

The substrate 208 may be placed in an etching chamber where the low-k dielectric layer 204 is etched (step 120). A plasma dry etch may be used to etch the low-k dielectric layer 204, which forms an opening 224 under the aperture 220 in the patterned resist mask 216, as shown in FIG. 2B. Some of the patterned resist mask 216 is removed during the low-k dielectric layer etch. Such low-k dielectric etches may use a chemical etch, such as using a fluorine based etchant. Specific examples of such etches will be discussed below, although various etch processes may be used.

A gas-modulated cyclic stripping process is then provided to remove the photoresist mask 216 and ARC layer 214 without damaging the low-k dielectric layer (step 124). If the ARC layer is DARC, it does not need to be removed. The photoresist mask 216 illustrated in this example is a single photoresist mask formed from a single photoresist layer.

In some embodiments of the invention, the barrier layer 210 may be opened before or after the photoresist 216 is stripped.

Etching Process

In one embodiment of the invention, during the step of etching the low-k dielectric, protective layers may be formed on the sidewalls of the feature. It is believed that forming protective layers, such as sidewall passivation layers that are on the order of 10 nm thick or greater and then etching, while using the protective layers as a passivation layer, may cause striations and faceting. Without being bound by theory, it is believed that layers of such thickness are not sufficiently conformal to provide desired protection against striation. It is believed that the thin protective layers provided by the invention significantly reduce striation. Such a thin protective layer may also reduce faceting. It is also believed that this reduces CD enlargement, providing CD control or control of CD bias, where CD bias is defined as CD change during etch.

In this embodiment, a method is provided in which an in-situ gas-modulated cyclic etch process alternates between a protective layer formation phase and an etch phase to enhance the overall etch performance without unduly sacrificing simplicity and cost-effectiveness. The modulation specifically includes cyclic variation of the composition and/or flow ratios of the process feed gases, and may also include synchronized variations in the RF power, gas pressure, and temperatures. The cyclic process is characterized by a total cycle time and by the cycle time ratio, which is the ratio between time for the protective layer formation phase and the time for the etch phase.

U.S. patent application Ser. No. 10/295,601, entitled "METHOD FOR PLASMA ETCHING PERFORMANCE ENHANCEMENT, by Huang et al., filed on Nov. 14, 2002 and incorporated by reference for all purposes, discloses that an in-situ plasma process may be used to enhance and/or repair the mask and/or the vertical sidewalls of etching features, during the etching progression. In such a process, a plasma chemical process step is initiated for a short duration before and/or after the wafer is exposed to an etching plasma for a desired duration.

In this embodiment, this approach is modified such that the process step responsible for protecting the mask and sidewalls is introduced as one phase of a gas-modulated cyclic process, in alternation with a compatible etch phase.

The protective layer formation process may be chosen in such a way that a thin film of material is formed on the surfaces of the mask and/or the sidewalls of the film being etched to prevent etch erosion, faceting, and striation. This thin coating may be of a material that is compatible with later stripping process for ease of final removal but more etch resistant than the mask materials. For example, a carbon-rich thin film, containing very low to no amount of other elements, may be used to coat a photoresist mask so that protected mask features are not easily eroded by the subsequent etching process. In other words, it may change the surface composition of the mask pattern such that the mask behaves like a pseudo hardmask, having certain beneficial etching characteristics of an amorphous carbon hardmask. Alternatively, the layer forming process may also be used in such a way that the formation of the thin coating on the mask pattern largely compensates for and/or repairs the mask patterns damaged/eroded by the prior etch process. The relative inertness of the coating to the subsequent etching reaction is beneficial so as to not to alter the fine balance obtained in the etching step. Alternatively, the thin coating may be produced using process conditions, which provide a smooth conformal coverage of sidewalls, preventing the initiation of striations due to rough and/or corrugated sidewall polymer coatings.

The etching gas mixture may contain etchant species and a passivation species so as to not lose the benefits associated with a passivation gas in the etching chemistry. The ratio of the etching to passivation components, along with a plurality of other processing conditions, is finely balanced to achieve optimum processing results, such as photoresist selectivity, etching anisotropy and etching rate etc. The electrical discharge power may be kept high and the energy of the charged particles is also kept high to obtain high etch rate and good etching anisotropy in small dimensional structures. The protective layer formation and etching cycle is repeated a large number of times until the completion of the etching task.

Figure 3:
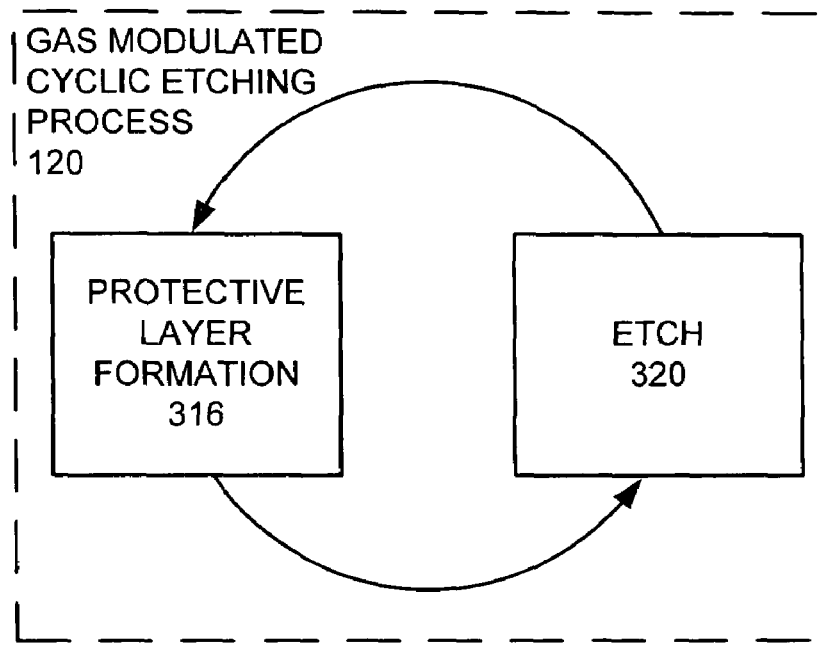
FIG. 3 is a more detailed flow chart of a gas-modulated cyclic etching process.

To facilitate understanding, FIG. 3 is a more detailed flow chart of the step of etching the low-k dielectric layer (step 120) in an embodiment of the invention. During the gas-modulated cyclic etch process, a process chamber modulates between at least two phases. One phase is a step optimized to form a protective layer (step 316). The other phase is a step optimized for etching (step 320). The alternation between these phases is achieved by synchronized modulation of gas flow rates, and possibly RF power, surface temperature, and gas pressure. In the preferred embodiment, a total cycle time is not greater than about 21 seconds. More preferably, a total cycle time is performed in 0.01 to 10 seconds. Most preferably, a total cycle time is performed in 0.5 to 5 seconds. Preferably, the cycle time ratio (protection: etch) is between 0.01 and 20. More preferably, the cycle time ratio (protection:etch) is between 0.05 and 5. Most preferably, the cycle time ratio (protection:etch) is between 0.2 and 1. Preferably, the gas-modulation is carried out for between about 3 to 50,000 cycles. More preferably, the gas-modulation is carried out for about 20 to 1000 cycles. Most preferably, the gas-modulation is carried out at least about 100 cycles.

During a phase optimized to form a protective layer (step 316), a protective layer is deposited on side walls of the etched features and possibly on top of the etch mask. The deposition may be asymmetric so that the amount of deposition is formed preferentially more on the masking material than on the sidewalls. This may be aided by the line-of-sight of the location to the deposition source as well as by the selective nature of the chosen deposition process. In other words, the deposition chemistry may be chosen in such a way that a coating is formed preferentially on the masking materials due to differences in the chemical reactivity of the materials. In the preferred embodiment, the deposition is done in-situ in an etch chamber using a plasma enhanced chemical vapor deposition (CVD) process, which deposits a thin protective layer on the sidewall of the photoresist. The deposition process may apply some ion bombardment energy to allow for selectivity of such deposition. In such a process the thickness of the sidewalls may be about two-thirds the thickness of the layer on top of the mask.

In other embodiments, the processing conditions may be changed as the etch front progresses through the material being etched to vary the thickness and spatial distribution of the protective layer. For example, it may be desirable to form a thicker coating on the sidewall of the film being etched as the etching proceeds deeper in order to protect the sidewalls from further distortion by the subsequent etching. A variation of cyclic processing conditions as the etch proceeds may provide for this. Since the layer forming and etching are separate phases of the cycle, the process conditions for the layer forming phase may be optimized for this result without interfering with the etch phase. Alternatively the total cycle time and/or cycle time ratio may be adjusted as the etch proceeds to provide this variation, without any change to the process parameters for the individual phases. In another preferred embodiment, the protective layer may be only deposited on the sidewalls.

During the protective layer formation phase, the fluorine-to-carbon ratio of the deposition gas is not greater than 2:1. Examples of deposition chemistries that may be used for plasma enhanced CVD may be, but are not limited to, $CH_3F$, $CH_2F_2$, $C_2H_5F$, $C_3H_7F$, $C_2H_3F$, $CH_4$, $C_2H_4$, $C_2H_6$, $C_2H_2$, $C_3H_8$, and $SiH_4$, $Si(CH_3)_4$, $Si(C_2H_5)_4$. It is preferred that these chemicals are halogen free or have a halogen to carbon ratio of no greater than 2:1. Without being limited by theory, it is believed that the carbon based chemistry forms a thin etch resistant amorphous carbon layer. The silane $SiH_4$ would be used to form an amorphous silicon layer (or polycrystalline silicon layer) over the photoresist. In addition, the protective layer may have been modified with the presence of some F and H components. The presence of other elements, such as F, may be used to yield selective activity on different material surfaces such that deposition occurs preferentially on one but not the other materials, such as on the photoresist mask materials but not on $SiO_2$ layer, under appropriate ion bombardment. Other methods, such as sputtering, may be used to form the protective layer.

Table I is a table of some of the parameters that may be used in a protective layer formation phase of a cyclic process in an embodiment of the invention.

TABLE I

| | Preferred Range | More Preferred Range | Most Preferred Range |
|---|---|---|---|
| Bias Voltage | >50 volts | >100 volts | >300 volts |
| Bias Energy | >50 eV | >100 eV | >300 eV |

In this embodiment; an electrical negativity can be formed on the substrate holding the wafer materials (thereby applying a bias to the wafer) by applying a radio frequency (RF) voltage supplied by an RF power generator. This has the effect of drawing the positively charged particles towards the electrically biased substrate at an energy determined by the electrical negativity controlled by the amplitude of the RF voltage. It is, therefore, possible to supply and vary the ion bombardment energy by controlling the RF power (and hence the RF voltage) applied to the substrate holder.

The protective layer formation phase (step 316) is an independent phase in the cyclic etch process (step 312) which may include different combinations of deposition gases as required for different etching applications of different materials, where the deposition may provide a protective coating around the etching features including the masking features. Preferably, the time of the cycle devoted to this phase is about 0.005 to 7 seconds. More preferably, the time of the cycle devoted to this phase is about 0.05 to 5 seconds. Most preferably, the time of the cycle devoted to this phase is about 0.25 to 2.5 seconds. Preferably, a layer with a thickness of less than 100 Å is formed on the top and/or sidewalls over the duration of a single protective layer formation phase. More preferably, a layer between about 0.1 and 50 Å is formed on the top and/or sidewalls over the duration of a single protective layer formation phase. Most preferably, a layer between about 1 and 10 Å is formed on the top and/or sidewalls over the duration of a single protective layer formation phase. In the case of less than about 10 Å layer thickness, the coverage may more accurately be described as a fraction of a monolayer. In one embodiment, the protective layer forms a single monolayer over the duration of a single protective layer formation phase. In another embodiment, the protective layer forms a sub-monolayer, which is a layer that does not completely cover the surface with a single atomic or molecular layer but instead may provide a certain percentage (i.e. 75%) of surface coverage, over the duration of a single protective layer formation phase.

The etch phase 320 is an independent phase in the cyclic etch process 312 which is performed to advance the etch front, producing at least one etch feature (step 320). Etching applications may include, but are not limited to, a dielectric contact etch, including high aspect ratio contact (HARC), damascene etch, dielectric trench etch (shallow or deep), self-aligned contact etch, gate mask open etch, via dielectric etch, dual-damascene via etch, dual damascene trench etch, conductor gate etch, conductor deep trench etch, conductor shallow trench isolation etch, and hardmask opening.

Preferably, the etch phase uses a high ion energy to provide a directional etch. The etch phase may remove some or all of the protective layer over the duration of a single etch phase. All of the protective layer on some of the surfaces may be removed over the duration of a single etch phase. In this example, the protective layer forming the sidewall on the photoresist and at the bottom of the feature has been removed. Other parts of the protective layer may only be partially removed. In this example, only part of the protective layer on the top surface of the photoresist has been removed. In other embodiments, other parts of the protective layer may be partially etched way or completely etched away. The etch phase removes some of the layer to be etched, and advances the etch front.

Since the etch phase of the cyclic process uses high energy ions to provide a directional etch, a polymer former gas may be provided during the etch phase. The polymer former gases may be, for example, hydrocarbons, fluorocarbons, and hydrofluorocarbons, such as $C_4F_6$, $C_4F_8$, $CH_3F$, $CH_2F_2$, $CH_4$, $C_3F_6$, $C_3F_8$, and $CHF_3$. These polymer former gases would form a polymer layer that is continuously deposited and etched during the etch phase.

Table II is a table of some of the parameters that may be used in an etch phase of a cyclic process in the preferred embodiment of the invention.

TABLE II

|  | Preferred Range | More Preferred Range | Most Preferred Range |
| --- | --- | --- | --- |
| Bias Voltage | >200 volts | >300 volts | >400 volts |
| Bias Energy | >200 eV | >300 eV | >400 eV |

Preferably, the time of the cycle devoted to this phase is about 0.005 to 14 seconds. More preferably, the time of the cycle devoted to this phase is about 0.05 to 7 seconds. Most preferably, the time of the cycle devoted to this phase is about 0.25 to 2.5 seconds. Preferably the depth of the etch increases by less than 500 Å over the duration of a single etch phase. More preferably, the depth of the etch increases by between about 5 and 250 Å over the duration of a single etch phase. Most preferably, the depth of the etch increases by between about 10 and 50 Å over the duration of a single etch phase. In the case of a change in etch depth of less than about 10 Å in a single etch phase, this change may more accurately be described as a fraction of a monolayer of material removed during a single etch phase. In one embodiment, the amount of material removed over the duration of a single etch phase is about one monolayer. In another embodiment, the amount of material removed over the duration of a single etch phase is a less than one monolayer.

The cyclic process is repeated over many cycles. An additional protective layer is deposited on the photoresist mask. In this example, the remaining part of the old protective layer becomes part of the new protective layer. The feature is then further etched through the photoresist mask (step 312), providing a deeper contact hole. Preferably, this gas-modulated cycle or loop of providing alternating deposition and etching phases is repeated more than 3 times. More preferably, this cycle is repeated more than 20 times. Most preferably, this cycle is repeated at least 100 times.

When no further etching is desired, the gas-modulated cyclic process (step 312) is complete. In the last cycle, the etching phase may completely etch away the protective layer. However, a subsequent processing step after the cyclic etch process may also be used to remove the protective layer and/or complete the etch of the oxide layer.

In an alternative embodiment, the gas-modulated cyclic process may be terminated before the oxide etch is completed, allowing the incorporation of a conventional etch step to complete the etch. This may be desirable as a means of controlling selectivity to the stop layer underlying the oxide layer.

Examples of materials for the photoresist mask may include, but are not limited to the newer generation of photoresists, such as, deep UV photoresist, 193 nm photoresist, 157 nm photoresist, EUV photoresist, e-beam photoresist, and x-ray photoresist. The older generation of photoresist polymer materials are designed to contained unsaturated C-C bonds, such as the C-C double bond and phenolic groups to provide the required high etching resistance, namely, chemical inertness to the etching gas mixture. These bonds are strong and require a high activation energy to break and therefore, at relatively low ion energies, the older generation photoresist can show remarkably low etching rate to the etching gas mixture. The newer generation of photoresist, including 193 nm and 157 nm, may not contain these unsaturated bonds because these unsaturated bonds absorb at the lithography exposure wavelength. The absence of these unsaturated bonds leads to much reduced photoresist etching resistance. By providing protective coatings on the photoresist during the cyclic process etch, the etching resistance of the photoresist is much improved, even at high ion bombardment energy. The high ion bombardment energies at which the invention may improve etching resistance of the photo resist may be 50-2,000 eV. More preferably, the ion bombardment energy may be 200-1,500 eV. Most preferably, the ion bombardment energy is 500-1,000 eV.

Without being bound by theory, it is believed that cyclic processing provides a different processing regime, because the properties of extremely thin films, deposited and etched in short timescales, are different from the properties of thicker films. Using the gas-modulated cyclic processing approach, with short cycle times, an extremely thin protective layer is deposited, such as a sidewall film or film on the top photoresist surface. This film and the oxide film are subsequently etched in very small amounts during the next phase of the cycle. The thin protective layer thickness may be in the monolayer range (i.e. sub-monolayers, monolayers, or layers of a few atoms or molecules).

The production of thin protective layers in the monolayer range is dependent on the deposition rate times the deposition time. Various deposition rate and deposition time combinations may be used to provide a thin protective layer in the monolayer range. For example, a deposition that provides a sidewall deposition rate of approximately 1 nm/sec and a top surface deposition rate of approximately 2 nm/sec provides a monolayer range thin protective layer with an approximately 0.5 nm thickness, when the deposition step is for 0.25-0.5 seconds per cycle. (i.e. a 1 nm/sec deposition rate×0.5 seconds=0.5 nm deposition.). The same monolayer range may be achieved by increasing the deposition rate and decreasing the cycle time or by decreasing the deposition rate and increasing the cycle time. This flexibility provides additional control variables.

Without being bound by theory, it is further believed that as the thickness of the protective film approaches the dimensions of the constituent molecules, e.g. approaching monolayer coverage, the film may adopt chemical and physical properties, which are distinct from bulk properties of the protective film. In this regime, the concept of a thin film may no longer be applicable and it may be more accurate to consider the mixture of chemical species present in the surface and near-surface region of the material. Such species may be present as loosely bound physisorbed species, as more tightly bound chemisorbed species, or as parts of larger structures, e.g. polymer molecules, glasses, or bulk crystals. These surface and near-surface species will include protective species deposited during the protective layer phase of cyclic processing, but may also include species deposited or evolved during the etch phase of the cyclic process, as well as other species from the original substrate or arising from chemical reactions between the various species. The unique properties in the approximate monolayer regime may result from the interaction of these different surface and near-surface species with each other and with the substrate material. These interactions would be suppressed in the case of a thicker protective film, which would cover the substrate with several monolayers or more in each protective layer phase, and therefore expose only the surface of the protective material by the time the next etch phase begins.

Without being bound by theory, it is further believed that in the extreme where surfaces are receiving limited flux within each cycle, corresponding to submonolayer coverage during each individual protection and etch phase, a truly novel process regime is achieved. In this case, the concept of alternating process steps becomes inaccurate at a microscopic scale, even though it is actually being used to control the process. At a microscopic scale, the surface reactions will proceed based on the arrival and departure of species and the chemical reactions of these species. Reactions occur continually but are punctuated by the occasional impact of an energetic species, such as an ion, which can drive hyper-thermal reactions. Most of the critical reactions occur during these brief instants of excitation. In the submonolayer regime of cycling, the surface sees a quasi-steady state where the flux of reactants reaching the surface is essentially an average of the two different plasma conditions, with reactions occurring between the mixture of these species.

It is believed that this is a fundamentally different regime from traditional, single-step, steady state etching, because the mixture of species reaching the surface is produced from two distinct plasma conditions. If the process conditions of the phases of the gas-modulated cyclic process were combined into a single steady-state recipe step, the resulting time-averaged flux of species reaching the surface would be modified due to the interaction of the different gases in the plasma. It is believed that by separating the plasma conditions in time with gas-modulated cyclic processing, the overall mixture of species reaching the surface can be controlled to an unprecedented degree. Conditions for the two different phases of the cycle can be very different, due to the ability to modulate the gas chemistry. As a result, very different chemical species can be produced in the different phases of the cycle, to achieve a mixture, which might be impossible with a single-step steady-state process. This mixture is the linear combination of fluences from the two discrete plasma conditions produced by the alternating phases of the cycle. The ratio of these fluences is controlled by the cycle time ratio. The cycle time ratio therefore becomes an additional process control variable.

The gas-modulated cyclic processing approach is able to provide a regime of near-monolayer and sub-monolayer coverage (monolayer range) that is accessible in the short cycle time regime. By increasing the cycle time sufficiently, the regime of bulk protective layers, with thicknesses of many monolayers, alternating with sustained etch conditions, may also be accessed. Between these two extremes of cycle time, a continuum of behavior may be accessed, to allow the balancing of desirable and undesirable results characteristic to the two extremes of the approach. Therefore, the inventive gas-modulated cyclic processing provides the flexibility to provide all of these regimes in this continuum. The total cycle time therefore becomes an additional process control variable.

Figure 7A:
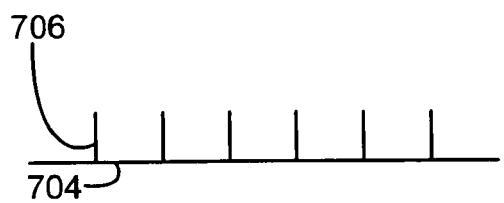
FIGS. 7A-E schematically illustrate the build up of material on a surface in an inventive regime of fast cycling using submonolayers.
Figure 7B:
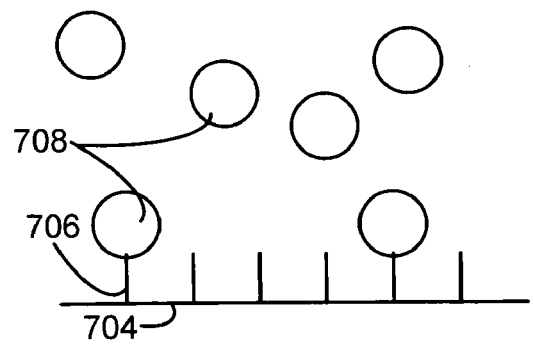
Figure 7C:
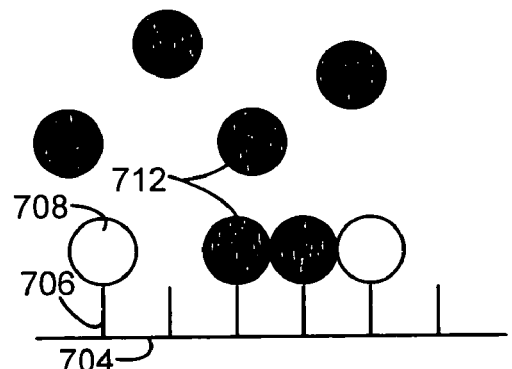
Figure 7D:
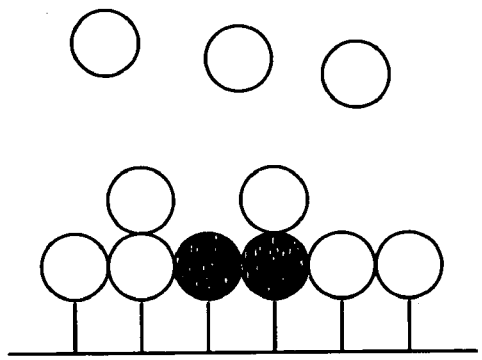
Figure 7E:
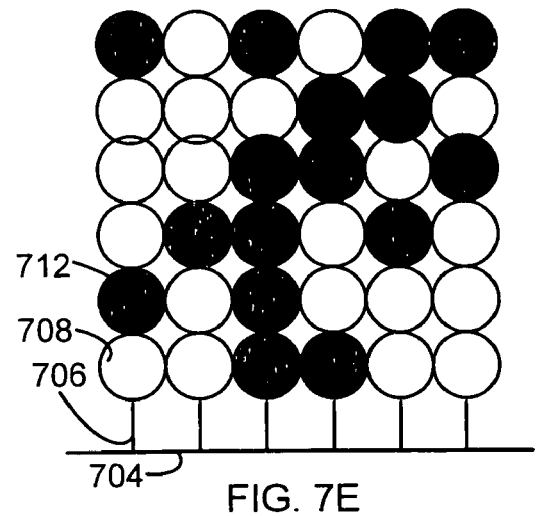

FIGS. 7A-E schematically illustrate the build up of material on a surface in the regime of fast cycling using sub-monolayers. In this example, each phase of the cyclic process is adding species to the surface sites, but different species are produced in the different phases. This is indicated by the alternation between black and white circles above the surface for the different phases. These circles represent depositor molecules in the gas phase and on the surface. In FIG. 7A, an initial sidewall surface 704 is shown with surface sites 706 unoccupied. FIG. 7B shows the effect of the first phase of the cyclic process, where a first species 708 of depositor molecules produced by the plasma conditions of the first phase are deposited on surface sites 706 of the surface 704. Note that not all surface sites 706 are occupied during the first application of the first phase. FIG. 7C shows the effect of the second phase, where a second species 712 depositor molecules produced by the plasma conditions of the second phase, which are different from the first species 708 of depositor molecules of the first phase due to the modulation of gas chemistry and possibly other process parameters. Less than one monolayer is added to the surface coverage in this application of the second phase. FIG. 7D shows the effect of the next application of the first phase of the cyclic process. In this application, monolayer coverage is completed and a second layer begins to form. FIG. 7E shows the result after several cycles, which is a mixed film with each layer composed of the different species 708, 712 produced in the first and second phases.

Figure 8A:
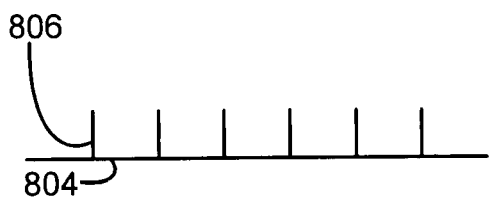
FIGS. 8A-D schematically illustrate the build up of material on a surface in the regime of slower cycling.
Figure 8B:
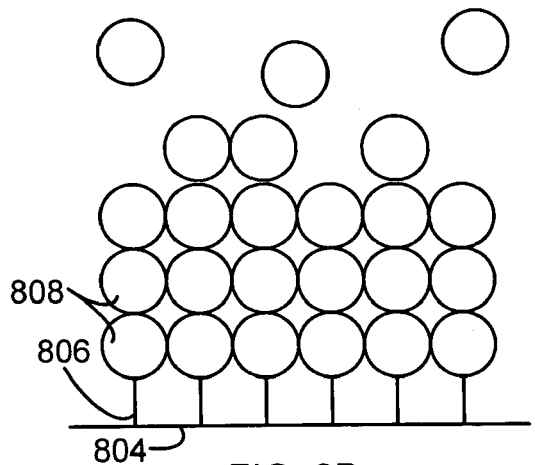
Figure 8C:
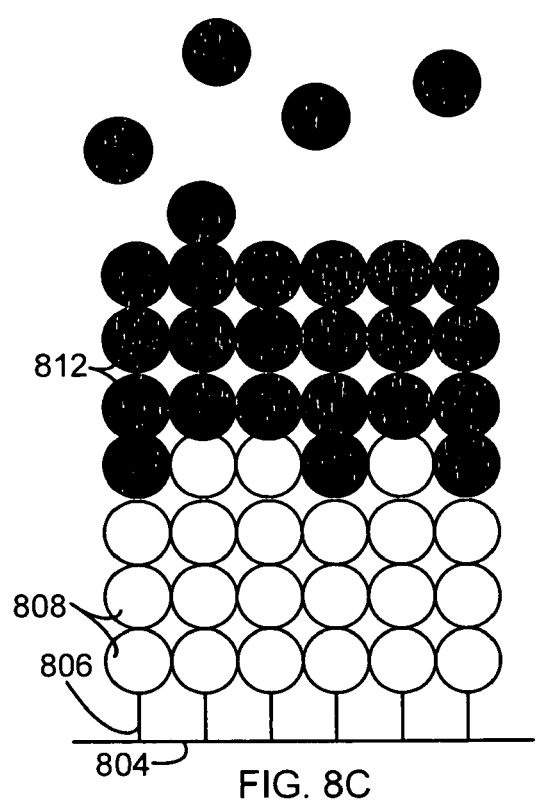
Figure 8D:
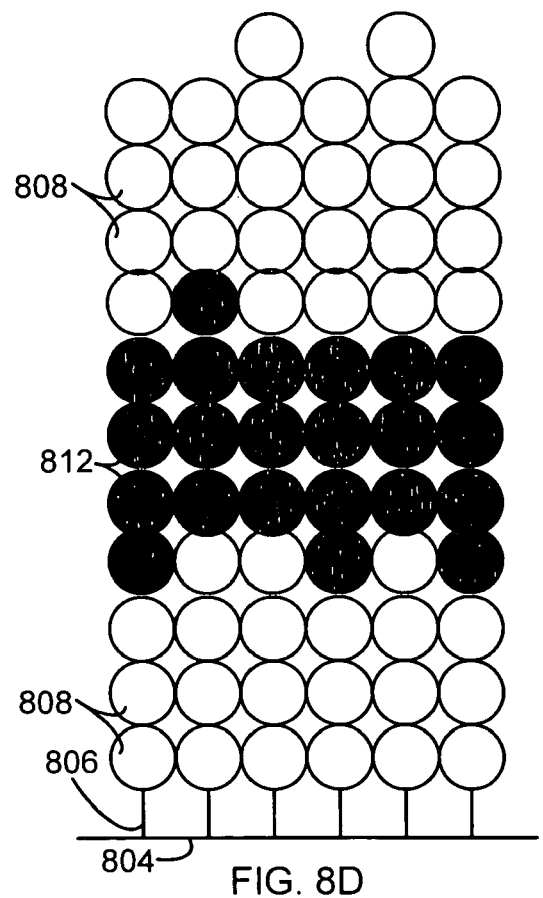

FIGS. 8A-D schematically illustrate the build up of material on a surface in the regime of slower cycling. This is achieved by the same conditions of the example in FIGS. 7A-E, with only the total cycle time increased by roughly a factor of ten. In FIG. 8A, an initial surface 804 is shown with surface sites 806 unoccupied. FIG. 8B shows the effect of the first phase of the cyclic process, where a first species 808 of depositor molecules produced by the plasma conditions of the first phase are deposited on surface sites 806 of the sidewall surface 804. In this case, several monolayers of surface coverage are added during the first application of the first phase. FIG. 8C shows the effect of the second phase of the cyclic process, where a second species 812 of depositor molecules produced by plasma conditions of the second phase are deposited on the layer formed by the first species 808 of depositor molecules. Several monolayers of surface coverage are added during the first application of the second phase. FIG. 8D shows the result after one-and-one-half cycle, where is an alternating stack of two different films, with multilayer film composed of layers of the first species 808 and the second species 812, each produced during a single phase of the cyclic process.

These examples are presented to show the qualitatively different microscopic results, which may be achieved as the total cycle time becomes comparable to the time required to deposit a single monolayer of the surface. It is believed that the different surface films produced in these two examples may correspond to different process results on the wafer structures, based solely on the variation of total cycle time. This is a simple example, with deposition as the only surface mechanism, but similar arguments could be applied to a more complex combination of surface mechanisms. For example, a surface which is alternately exposed to deposition and etchant species by the alternating phases of the cyclic process could also exhibit modified behavior when the total cycle time becomes comparable to the time required to deposit or etch a single monolayer of the surface.

As discussed above, it is believed that by using alternating protective and etching steps, striation and faceting may be reduced and better etch control may be provided. Without being bound by theory, it is believed that the regime of near-monolayer and sub-monolayer protective coverage which is accessible through gas-modulated cyclic processing and the protective capabilities of the alternating approach may be controlled and modified to provide unique properties that may help to reduce striation and faceting and provide better etch control.

The gas-modulated cyclic processing step may be carried out by using the same carrier gas flow for both forming the protective layer and etching, while reactants for forming the protective layer and reactants for etching are alternately provided. In addition, the RF power, temperature, and/or pressure may be pulsed in synchronization with the gas flows to provide optimal conditions for each phase in the gas-modulated cyclic process.

In another embodiment the entire gas mixture of carrier gases and reactants are alternated. Again, the RF power, temperature, and/or pressure may be pulsed in synchronization with the gas flows to provide optimal conditions for each phase in the cyclic process. In another embodiment, the same gases may be used for both phases, but the relative flow ratios are changed for each phase. Therefore, to provide a different gas chemistry between two different phases of the gas-modulated cyclic process, one could use two entirely different gases, or use the same carrier gas and different active gases, or use the same gases with different relative flows.

In an example of different gas chemistries using the same carrier gas flow for both forming the protective layer and etching, the etchant gas from the etching gas source is not provided to the plasma processing chamber during the protective layer formation phase. This may be done by not providing a component of the etching gas or deposition gas. For example, oxygen or an oxygen containing gas is a key etching component to an etching gas. Even though $C_4F_6$ is also used in the etchant gas, etching cannot be accomplished by $C_4F_6$ without oxygen in this example. Therefore, by not providing oxygen or an oxygen containing gas during the protective layer formation phase is a method of not providing the etching gas during the protective layer formation phase, even if $C_4F_6$ is provided during the formation of the protective layer. It is also preferred that the formation of the protective layer process is a non-etching or negligently etching at most (comprising less than 10% of the layer to be etched) for forming the protective coating. Such a deposition process may be, but is not limited to, plasma enhanced CVD deposition or sputtering, since CVD and sputtering are not used for etching. If the deposition gas is the same as the polymer former in the etch phase, then the deposition gas may be provided during the etch phase. In addition, bias power during the etch phase may be higher to provide the directional etching.

Providing a separate deposition phase and the presence of the polymer former to provide polymerization during the etch phase allows the use of higher energy etching ions for higher etching rate and better anisotropic etching. By keeping passivation gases in an etch phase mixture, it is possible to use higher ion energies without unacceptable erosion and damage of the etching mask. Additionally, anisotropic etching can be achieved during the duration of the etching phase. By using cyclic process with alternating protective layer forming phases and etch phases, mask protection can be optimized. This approach avoids inter-reactions of etching and retardation gases in the discharge. For example, a deposition chemical mixture may be chosen that forms a harder and more durable coating than produced by an etching mixture. Additionally, the deposition chemistry conditions, such as pressure and concentration, may be tailored to optimize the properties of the protective layer formation such as the composition and thickness.

It may be desirable that some of the components of the deposition gas are not mixed with components of the etch gas, since some mixing decreases the efficiency of having separate deposition and etch phases. As a result, the controller in such cases would synchronize the modulated gas flows so that one gas is depleted before another gas is added.

By having independent protective layer formation and etch-passivation phases, the processing conditions, such as temperature, power, pressure, ion energy, and processing gases, may be independently controlled varied to provide optimal conditions for each phase.

Argon or other inert gases may be used as carrier gases during both the etching and protective layer formation. An example of another inert gas would be neon.

In an embodiment of the invention, the chamber wall areas, which may contact the plasma (a mixture of chemicals and charged particles sustained by the electrical discharge), are made to be as small as possible and to be maintained at elevated temperatures. The object of this is to avoid the so-called chamber "memory" effect, by which the chemical elements contained in the coating of the chamber wall areas formed in one processing step can be released to interfere with the subsequent steps. By minimizing the total deposition on the chamber wall areas, this effect can be reduced, avoiding an interaction between the two different phases, which may degrade the performance.

It may also be desirable that the gas travel time from the precursor source to the processing chamber is made to be very short. The gas flow stability time, denoting the time to establish a constant desired flow and the time to establish complete absence of the said gas at the processing chamber, is made to be very short so that the transition from one stable gas mixture composition to the next can be made to be very fast. The object of this is to avoid inter-mixing of chemicals between two different phases, which may degrade the performance.

It may also be desirable that the electrical system and the control network controlling the conversion of the electrical power into an electrical discharge reacts very fast with respect to the changes of the discharge conditions and power requirements. Furthermore, it may desirable to be able to quickly change and stabilize other external conditions of the processing chamber, such as the pressure of the gas mixture and the temperature of the wafer substrate. Allowing such process conditions to be changed quickly allows for a shorter total cycle time and allows the process conditions to be varied significantly between phases to optimize each phases individually. Therefore, it may also be desirable to have a computerized system that is able to control and synchronize the rapid modulation of the processing conditions. The computer system is used to send commands for the required periodic changes and to synchronize these commands using pre-determined time delays for the various devices providing the plurality of condition changes in the processing chamber.

Other embodiments of the invention may provide one or more additional phases to the cyclic process. For example, a gas-modulated cyclic process may have six phases, such as three deposition phases and three etching phases in a single cycle. The addition of additional phases may be limited by the increased complexity of each cycle.

Another embodiment may eliminate the use of a polymer providing gas during the etch phase. Another embodiment of the invention may provide two etch phases, instead of a deposition phase and etch phase. In such an embodiment, one etch phase may be an etch process condition that yields a tapered profiled, while a second etch phase may be an etch process condition that yields a bowed profile. In the regime of short cycle times, each phase of the cycle might modify less than one, roughly one, or a few monolayers of the surface being etched. In this case the alternation between two different etch phases would produce refined process control capability. Again, the gas-modulated cyclic approach provides the capability to deliver a mixture of species to the surface, which could not be produced by a single-step steady-state condition. In addition, the ratio between species produced in each phase is easily controlled by the cycle time ratio. Another embodiment of the invention may provide two deposition phases and a single etch phase. Another embodiment of the invention may provide a single deposition phases and two etch phases. Another embodiment of the invention may provide a sequence of gas-modulated cyclic processes, each cyclic process distinguished by the total cycle time, the cycle time ratio, and/or the process conditions for the individual phases. These phase conditions include gas compositions, gas flows, RF power, pressure, and/or temperature. The layer to be etched is a low-k dielectric film such as organosilicate glass or SiLK.

Cyclical Stripping Process

Figure 4:
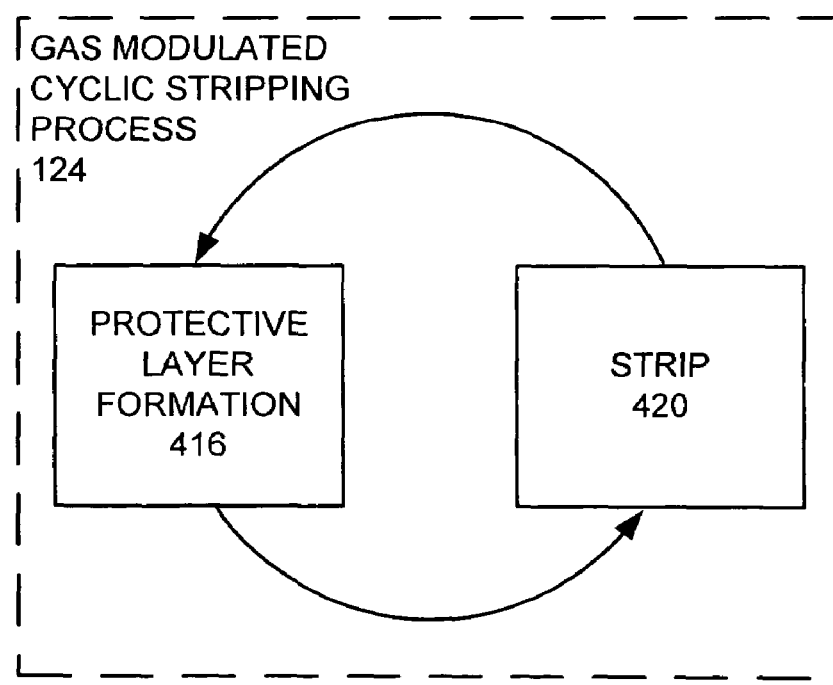
FIG. 4 is a more detailed flow chart of a gas-modulated cyclic stripping process.

To facilitate understanding, FIG. 4 is a more detailed flow chart of the step of gas-modulated cyclic stripping process (step 124) for stripping a single photoresist mask in an embodiment of the invention. During the gas-modulated cyclic stripping process, the process chamber modulates between at least two phases. One phase is a step optimized to form a protective layer (step 416). The other phase is a step optimized for stripping (step 426). The alternation between these phases is achieved by synchronized modulation of gas flow rates, and possibly RF power, surface temperature, and gas pressure. In the preferred embodiment, a total cycle time is not greater than about 21 seconds. More preferably, a total cycle time is performed in 0.01 to 10 seconds. Most preferably, a total cycle time is performed in 0.5 to 5 seconds. Preferably, the cycle time ratio (protection: etch) is between 0.01:1 and 20:1. More preferably, the cycle time ratio (protection:etch) is between 0.05:1 and 5:1. Most preferably, the cycle time ratio (protection:etch) is between 0.2:1 and 2:1. Preferably, the gas-modulation is carried out for between about 3 to 50,000 cycles. More preferably, the gas-modulation is carried out for about 10 to 500 cycles. Most preferably, the gas-modulation is carried out at least about 50 cycles. Preferably, the gas-modulated cyclic stripping process is used to strip a single photoresist mask. Such a single photoresist mask is a patterned photoresist mask, instead of a photoresist mask patterned for a via etch and a photoresist mask patterned for a trench etch. More preferably, such a single photoresist mask is of a single layer of photoresist.

During a phase optimized to form a protective layer (step 416), a protective layer is deposited on side walls of the etched features and possibly on top of the photoresist mask. The deposition may be asymmetric so that the amount of deposition is formed preferentially more on the sidewalls than on the photoresist mask. In other words, the deposition chemistry may be chosen in such a way that a coating is formed preferentially on the side walls due to differences in the chemical reactivity of the materials. In the preferred embodiment, the deposition is done in-situ in an etch chamber using a plasma enhanced chemical vapor deposition (CVD) process, which deposits a thin protective layer on the sidewalls of the etch features. In addition, in the preferred embodiment, the deposition and stripping steps are performed in the same chamber. The deposition process may apply some ion bombardment energy to allow for selectivity of such deposition.

In other embodiments, the processing conditions may be changed as the stripping progresses to vary the thickness and spatial distribution of the protective layer. For example, it may be desirable to form a thicker coating on the sidewall of the features as the stripping proceeds. A variation of cyclic processing conditions as the etch proceeds may provide for this. Since the layer forming and stripping are separate phases of the cycle, the process conditions for the layer forming phase may be optimized for this result without interfering with the stripping phase. Alternatively, the total cycle time and/or cycle time ratio may be adjusted as the stripping proceeds to provide this variation, without any change to the process parameters for the individual phases.

The protective layer formation phase 416 is an independent phase in the cyclic stripping process 412 which may include different combinations of deposition gases as required for different applications of different materials, where the deposition may provide a protective coating around the features. Preferably, the time of the cycle devoted to this phase is about 0.005 to 10 seconds. More preferably, the time of the cycle devoted to this phase is about 0.1 to 5 seconds. Most preferably, the time of the cycle devoted to this phase is about 0.2 to 2.5 seconds. Preferably, a layer with a thickness of less than 200 Å is formed on the sidewalls over the duration of a single protective layer formation phase. More preferably, a layer between about 0.1 and 100 Å is formed on the sidewalls over the duration of a single protective layer formation phase. Most preferably, a layer between about 1 and 10 Å is formed on sidewalls over the duration of a single protective layer formation phase. In the case of less than about 10 Å layer thickness, the coverage may more accurately be described as a fraction of a monolayer. In one embodiment, the protective layer forms a single monolayer over the duration of a single protective layer formation phase. In another embodiment, the protective layer forms a sub-monolayer, which is a layer that does not completely cover the surface with a single atomic or molecular layer but instead may provide a certain percentage (i.e. 75%) of surface coverage, over the duration of a single protective layer formation phase.

The stripping phase 420 is an independent phase in the cyclic stripping process 128, which is performed to advance the stripping.

Preferably, the time of the cycle devoted to this phase is about 0.005 to 10 seconds. More preferably, the time of the cycle devoted to this phase is about 0.1 to 5 seconds. Most preferably, the time of the cycle devoted to this phase is about 0.2 to 2.5 seconds.

Preferably, this gas-modulated cycle or loop of providing alternating deposition and etching phases is repeated more than 3 times. More preferably, this cycle is repeated more than 10 times. Most preferably, this cycle is repeated at least 50 times.

When no further etching is desired, the gas-modulated cyclic stripping process (step 124) is complete. In the last cycle, the etching phase may completely etch away the protective layer. However, a subsequent processing step after the cyclic stripping process may also be used to remove the protective layer and/or complete the stripping process.

Without being bound by theory, it is believed that cyclic processing provides a different processing regime, because the properties of extremely thin films, deposited and etched in short timescales, are different from the properties of thicker films. Using the gas-modulated cyclic processing approach, with short cycle times, an extremely thin protective layer is deposited, such as a sidewall film. The thin protective layer thickness may be in the monolayer range (i.e. sub-monolayers, monolayers, or layers of a few atoms or molecules).

The production of thin protective layers in the monolayer range is dependent on the deposition rate times the deposition time. Various deposition rate and deposition time combinations may be used to provide a thin protective layer in the monolayer range. The properties of such thin protective layers has already been discussed above regarding etching.

Without being bound by theory, it is believed by cyclically depositing a protective layer and stripping photoresist, the protective layer may be kept thin, instead of continuously adding more protective layer in one long step.

The layer to be etched over which the photoresist is stripped is preferably a low-k dielectric film such as organosilicate glass or SiLK. The protective layer prevents damage to the low-k dielectric film during the stripping.

In one embodiment, the same gases and process parameters may be used for both phases, but the relative flow ratios of the component gases are changed for each phase.

In another embodiment, the gas-modulated cyclic strip processing step may be carried out by using the same carrier gas flow for both forming the protective layer and stripping, while reactants for forming the protective layer and reactants for stripping are alternately provided. In addition, other process parameters, such as the RF power, temperature, and/or pressure, may be pulsed in synchronization with the gas flows to provide optimal conditions for each phase in the gas-modulated cyclic process.

In another embodiment the entire gas mixture of carrier gases and reactants are alternated. Again, the RF power, temperature, and/or pressure may be pulsed in synchronization with the gas flows to provide optimal conditions for each phase in the cyclic process. Therefore, to provide a different gas chemistry between two different phases of the gas-modulated cyclic stripping process, one could use two entirely different gases, or use the same carrier gas and different active gases, or use the same gases with different relative flows.

An inert carrier gas may be added to either the deposition gas or the stripping gases. For example, a deposition step can be done by $C_2H_4$ and Ar.

Providing polymer forming gas during the stripping helps control the stripping process.

By having independent protective layer formation and stripping phases, the processing conditions, such as temperature, power, pressure, ion energy, and processing gases, may be independently controlled varied to provide optimal conditions for each phase.

Other embodiments of the invention may provide one or more additional phases to the cyclic stripping process. For example, a gas-modulated cyclic stripping process may have six phases, such as three deposition phases and three stripping phases in a single cycle. The addition of additional phases may be limited by the increased complexity of each cycle.

Another embodiment may eliminate the use of a polymer providing gas during the stripping phase.

EXAMPLE

In an example of the invention, a low-k dielectric layer of OSG was placed over a substrate (step 104). A silicon oxide cap layer was deposited over the low-k dielectric layer (step 108). The cap layer is about 500 Å thick. An organic ARC layer was formed over the cap layer (step 112). A patterned photoresist mask was formed over the ARC (step 116). In this example, the photoresist was 193 nm PR from Shipley.

Figure 5:
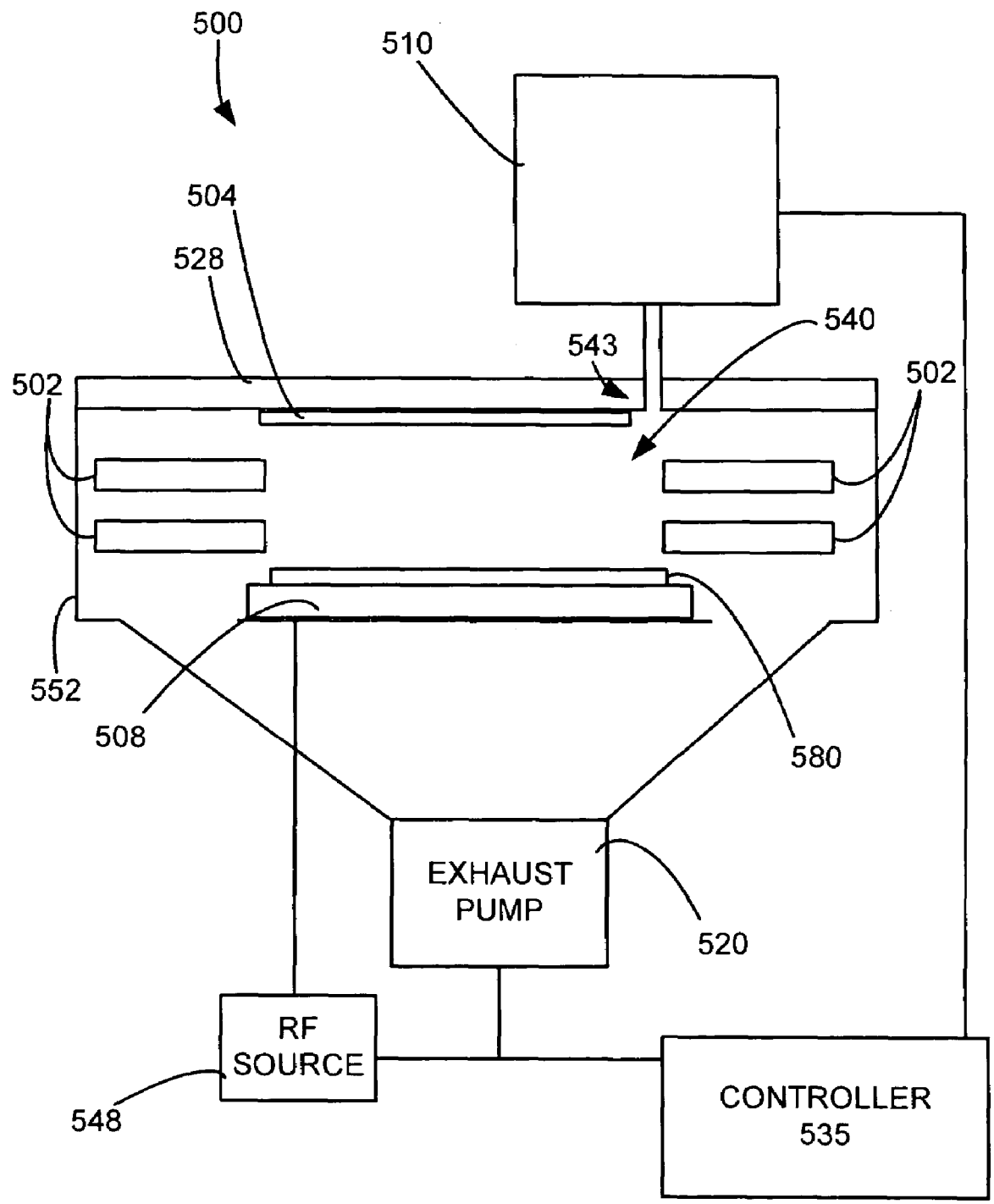
FIG. 5 is a schematic view of a system that may be used in practicing the invention.

The substrate was then placed in a process chamber. FIG. 5 is a schematic view of a process chamber 500 that may be used in the preferred embodiment of the invention. In this embodiment, the plasma processing chamber 500 comprises confinement rings 502, an upper electrode 504, a lower electrode 508, a gas source 510, and an exhaust pump 520. Within plasma processing chamber 500, the substrate wafer 580, over which the oxide layer is deposited, is positioned upon the lower electrode 508. The lower electrode 508 incorporates a suitable substrate chucking mechanism (e.g., electrostatic, mechanical clamping, or the like) for holding the substrate wafer 580. The reactor top 528 incorporates the upper electrode 504 disposed immediately opposite the lower electrode 508. The upper electrode 504, lower electrode 508, and confinement rings 502 define the confined plasma volume 540. Gas is supplied to the confined plasma volume by gas source 510 through a gas inlet 543 and is exhausted from the confined plasma volume through the confinement rings 502 and an exhaust port by the exhaust pump 520. The exhaust pump 520 forms a gas outlet for the plasma processing chamber. An RF source 548 is electrically connected to the lower electrode 508. Chamber walls 552 define a plasma enclosure in which the confinement rings 502, the upper electrode 504, and the lower electrode 508 are disposed. The RF source 548 may comprise a 27 MHz power source and a 2 MHz power source. Different combinations of connecting RF power to the electrodes are possible.

An 2300 Exelan™ dielectric etch system made by Lam Research Corporation™ of Fremont, Calif. modified to provided the cycle time required by the invention may be used in a preferred embodiment of the invention. The 2300 Exelan™ dielectric etch system is a capacitively coupled system. A controller 535 is controllably connected to the RF source 548, the exhaust pump 520, and the gas source 510. A showerhead may be connected to the gas inlet 543. The gas inlet 543 may be a single inlet for each gas source or a different inlet for each gas source or a plurality of inlets for each gas source or other possible combinations.

Figure 6A:
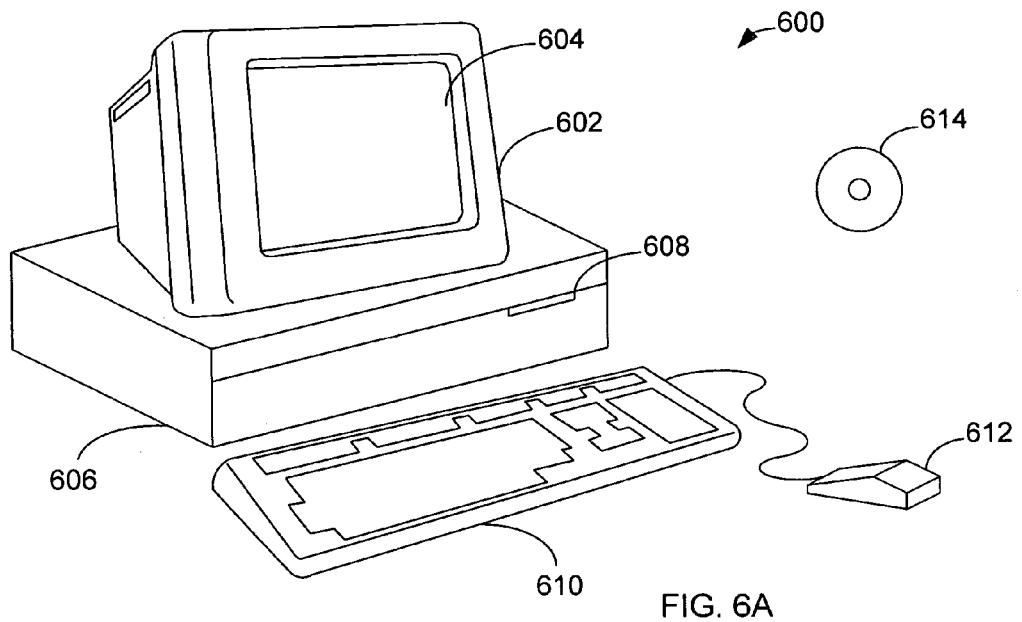
FIGS. 6A and 6B illustrate a computer system, which is suitable for implementing a controller used in embodiments of the present invention.
Figure 6B:
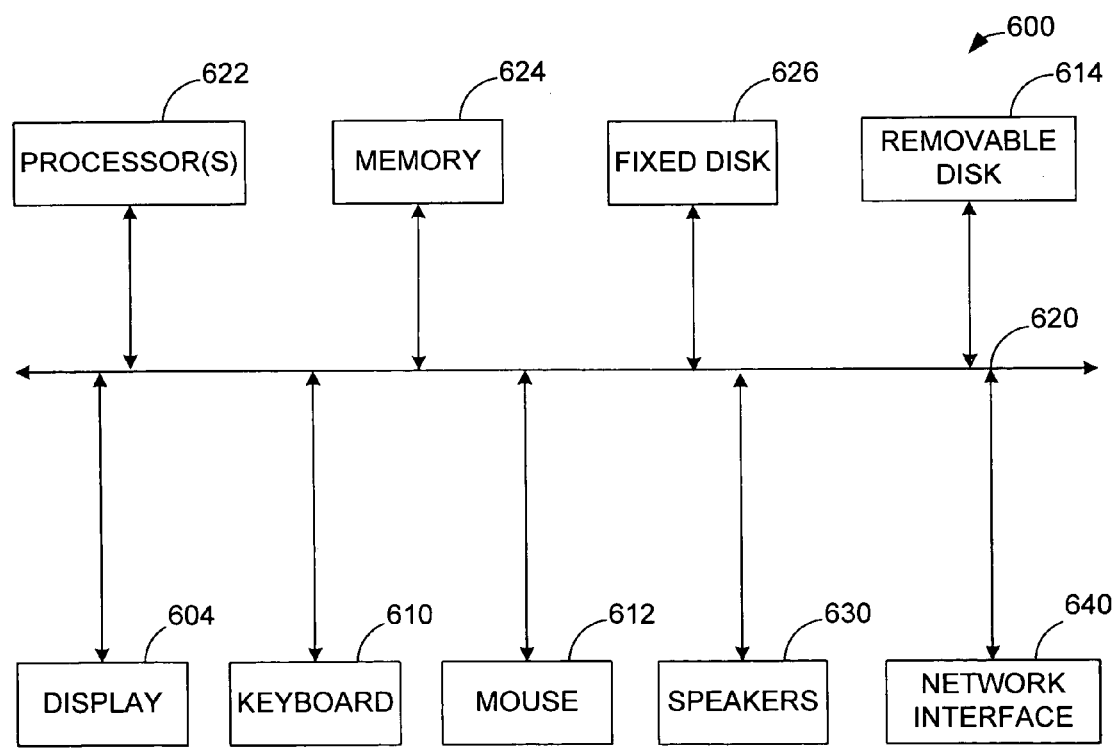

FIGS. 6A and 6B illustrate a computer system 600, which is suitable for implementing a controller 535 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 600 includes a monitor 602, a display 604, a housing 606, a disk drive 608, a keyboard 610, and a mouse 612. Disk 614 is a computer-readable medium used to transfer data to and from computer system 600.

FIG. 6B is an example of a block diagram for computer system 600. Attached to system bus 620 are a wide variety of subsystems. Processor(s) 622 (also referred to as central processing units or CPUs) are coupled to storage devices, including memory 624. Memory 624 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 626 is also coupled bi-directionally to CPU 622; it provides additional data storage capacity and may also include any of the computer-readable media described below. Fixed disk 626 may be used to store programs, data, and the like and is typically a secondary storage medium (such as a hard disk) that is slower than primary storage. It will be appreciated that the information retained within fixed disk 626 may, in appropriate cases, be incorporated in standard fashion as virtual memory in memory 624. Removable disk 614 may take the form of any of the computer-readable media described below.

CPU 622 is also coupled to a variety of input/output devices, such as display 604, keyboard 610, mouse 612 and speakers 630. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 622 optionally may be coupled to another computer or telecommunications network using network interface 640. With such a network interface, it is contemplated that the CPU might receive information from the network, or might output information to the network in the course of performing the above-described method steps. Furthermore, method embodiments of the present invention may execute solely upon CPU 622 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A feature was etched through the ARC layer and the low-k OSG layer (step 120). An etch chemistry of 100~500 sccm of Ar, 3~15 sccm of $C_4F_8$, 1~10 sccm of $O_2$, and 30~200 sccm of $N_2$ was used to etch through the low-k OSG layer. The chamber pressure was set to 60~500 mTorr. 300~1500 W were provided by the 27 MHz RF source.

After the feature was completely etched, the wafer a gas-modulate cyclic stripping process is provided (step 124). In this example, the same component gases $O_2$ and $C_2H_4$ are used both for the protective layer formation phase (step 416) and the stripping phase (step 420). The gas ratios of these gases are varied between the protective layer formation phase (step 416) and the stripping phase (step 420).

In this example, the recipe for the protective layer formation phase (step 416) provides a pressure of 45 mTorr. 300 watts are provided at 27 MHz, and 100 watts are provided at 2 MHz. 200 sccm of $O_2$ are provided. 100 sccm of $C_2H_4$ are provided. This phase is provided for 2 seconds each cycle.

In this example, the recipe for the stripping phase (step 416) provides a pressure of 45 mTorr. 300 watts are provided at 27 MHz, and 100 watts are provided at 2 MHz. 200 sccm of $O_2$ are provided. 10 sccm of $C_2H_4$ are provided. This phase is provided for 2 seconds each cycle.

Other embodiments may use chamber pressures between 2 mTorr and 300 mTorr. Power may be provided in a range from 50 watts to 900 watts. Between 100-500 sccm of $O_2$ may be provided. Between 50-500 sccm $C_2H_4$ may be provided. Each phase may be between 0.1 sec. to 5 sec. per cycle. In these examples, $O_2$ is used as a stripping gas and $C_2H_4$ is used as a protective layer forming gas. It is preferred that for stripping the ratio of stripping gas to protective layer forming gas is greater than 2:1. More preferably for stripping the ratio of stripping gas to protective layer forming gas is between 10:1 to 2:1. It is preferred that for forming the protective layer the ratio of stripping gas to protective layer forming gas is less than 1:1. More preferably for forming the protective layer the ratio of the stripping gas to protective layer forming gas is between about 1:1 and 1:10.

By optimizing the deposition step and strip step the strip damage could be improved by >50% compared with normal continuous strip process. The optimum conditions depended on low-k material, previous etch step, and the characteristics of PR. The gases, rf power, and pressures had to be optimized to get the best result.

Without wishing to be bound by theory, it is believed that the deposition step forms a thin protective coating over the sidewalls in the low-k dielectric layer. The subsequent stripping step both strips the photoresist mask and removes some of the protective coating. By providing a cyclical process, the protective layer is kept thin. This is believed to be advantageous over a single step that would both strip and provide a protective coating. In such a process, the single step would continue to form a protective layer, so that at the end of the stripping process a thick protective layer may remain. This would also be more advantageous over a process that provides a single protective layer deposition step and a single stripping step. Using a single deposition step, requires that a thick protective layer be formed, which may hurt critical dimensions of the resulting features.

Therefore, the protective layer formation phase uses a first gas chemistry and the stripping phase uses a second gas chemistry different from the first gas chemistry. In this example, both the first gas chemistry comprises both a protective layer forming gas and a stripping gas, in different proportions so that the first gas chemistry allows deposition and the second gas chemistry allows stripping. In other embodiments, the first gas chemistry may be only a protective layer gas without a stripping gas and the second gas chemistry may be only a stripping gas without a protective layer forming gas. These various embodiments may be summarized as the first gas chemistry comprising a protective layer forming gas and the second gas chemistry comprising a stripping gas.

Gases that may be used to form the protective layer forming gas may be selected from the group of $C_2H_4$, $CH_4$, $CH_4$, $C_2H_4$, $C_2H_6$, $C_2H_2$, $C_3H_8$, CO, $SiH_4$, $Si(CH_3)_4$, $Si(C_2H_5)_4$ $CH_3F$, $C_2H_5F$, $C_3H_7F$, and $C_2H_3F$. Generally, such protective layer gases are hydrocarbons.

Gases that may be used for the stripping gas may be selected from the group of $O_2$, $H_2$, $N_2$, water vapor, $CO_2$ and NH3.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a feature in a low-k dielectric layer through a photoresist etch mask over a substrate, comprising:
    placing a low-k dielectric layer over a substrate;
    placing a patterned photoresist mask over the low-k dielectric layer;
    etching at least one feature into the low-k dielectric layer; and
    performing a gas-modulated cyclic stripping process for more than three cycles for stripping a single photoresist mask, wherein each cycle comprises:
        performing a protective layer forming phase using a first gas, wherein the protective layer forming phase is performed in about 0.005 to 10 seconds for each cycle, comprising;
            providing the first gas; and
            forming a plasma from the first gas, wherein a protective layer is formed on sidewalls of the at least one feature and a thickness of the protective layer is increased, wherein the protective layer is a layer of deposited material that is relatively inert to etching reactions with respect to the photoresist mask; and
        performing a stripping phase for stripping the photoresist mask using a second gas, where the first gas is different than the second gas, wherein the etching phase is performed in about 0.005 to 10 seconds for each cycle, comprising:
            providing the second gas; and
            forming a plasma from the second gas, wherein the thickness of the protective layer is decreased and some of the photoresist mask is stripped.

2. The method, as recited in claim 1, wherein the protective layer forming phase forms a layer less than 200 Å thick.

3. The method, as recited in claim 1, wherein the protective layer forming phase forms a layer between about 0.1 and 100 Å thick.

4. The method, as recited in claim 3, wherein performing a gas-modulated cyclic stripping process is performed in a capacitively coupled plasma process chamber.

5. The method, as recited in claim 1, wherein the protective layer forming phase and the etching phase are performed in a common plasma processing chamber.

6. The method, as recited in claim 5, wherein the common plasma processing chamber is a capacitively coupled plasma processing chamber, wherein the forming the plasma from the first gas comprises providing capacitively coupled energy.

7. The method, as recited in claim 6, wherein the gas-modulated cyclic stripping process is performed for at least 3 cycles.

8. The method, as recited in claim 5, wherein the first gas comprises a protective layer forming gas and the second gas comprises a stripping gas.

9. The method, as recited in claim 8, wherein the protective layer forming gas is at least one of $C_2H_4$, $CH_4$, $CH_4$, $C_2H_4$, $C_2H_6$, $C_2H_2$, $C_3H_8$, CO, $SiH_4$, $Si(CH_3)_4$, $Si(C_2H_5)_4$ $CH_3F$, $C_2H_5F$, $C_3H_7F$, and $C_2H_3F$.

10. The method, as recited in claim 8, wherein the stripping gas is at least one of $O_2$, $H_2$, $N_2$, water vapor, $CO_2$ and $NH_3$.

11. The method, as recited in claim 10, wherein the first gas has a stripping gas to protective layer forming gas ratio of less than 1:1 and wherein the second gas has a stripping gas to protective layer forming gas ratio between 10:1 and 2:1.

12. The method, as recited in claim 1, wherein the gas-modulated cyclic stripping process is performed for at least 3 cycles.

13. The method, as recited in claim 1, wherein the first gas comprises a protective layer forming gas and the second gas comprises a stripping gas.

14. The method, as recited in claim 13, wherein the protective layer forming gas is at least one of $C_2H_4$, $CH_4$, $CH_4$, $C_2H_4$, $C_2H_6$, $C_2H_2$, $C_3H_8$, CO, $SiH_4$, $Si(C_2H_5)_4$ $CH_3F$, $C_2H_5F$, $C_3H_7F$, and $C_2H_3F$.

15. The method, as recited in claim 14, wherein the stripping gas is at least one of $O_2$, H2, N2, water vapor, $CO_2$ and NH3.

16. The method, as recited in claim 15, wherein the first gas has a stripping gas to protective layer forming gas ratio of less than 1:1 and wherein the second gas has a stripping gas to protective layer forming gas ratio between 10:1 and 2:1.

17. A method for removing at least part of a single layer over a substrate, comprising:
    performing a gas-modulated cyclic process for more than three cycles, wherein each cycle comprises:
        performing a protective layer forming phase using first gas chemistry with a deposition gas chemistry, wherein the protective layer forming phase is performed in about 0.005 to 10 seconds for each cycle, comprising;
            providing the first gas chemistry; and
            forming a plasma from the first gas chemistry, which causes a protective layer formed and the thickness of the protective layer to increase, wherein the protective layer is a layer of deposited material that is relatively inert to etching reactions with respect to the substrate; and performing a removal phase for removing at least part of the single layer using a second gas chemistry using a removal gas chemistry, where the first gas chemistry is different than the second gas chemistry, wherein the removal phase is performed in about 0.005 to 10 seconds for each cycle, comprising:

providing the second gas chemistry; and forming a plasma from the second gas chemistry to cause removal of at least part of the single layer.

18. The method of claim 1, wherein the first gas has a stripping gas to protective layer forming gas ratio of less than 1:1.

19. The method of claim 18, wherein the first gas has a stripping gas to protective layer forming gas ratio of between 1:1 and 1:10.

20. The method of claim 1, wherein the second gas has a stripping gas to protective layer forming gas ratio of between 10:1 and 2:1.

* * * * *